United States Patent

Sato et al.

[11] Patent Number: 5,427,668
[45] Date of Patent: Jun. 27, 1995

[54] THIN FILM DEPOSITION SYSTEM

[75] Inventors: Tatsuya Sato; Wasaburo Ohta; Mikio Kinoshita, all of Kanagawa, Japan

[73] Assignee: Ricoh Company, Ltd., Tokyo, Japan

[21] Appl. No.: 602,109

[22] Filed: Oct. 22, 1990

[30] Foreign Application Priority Data

Oct. 25, 1989 [JP] Japan .................. 1-278147

[51] Int. Cl.⁶ ..................... C23C 14/34; C23C 14/48
[52] U.S. Cl. ..................... 204/298.05; 118/723 HC
[58] Field of Search .................. 204/192.31, 298.05, 204/298.06, 298.14; 118/723 HC

[56] References Cited

U.S. PATENT DOCUMENTS

| | | | |
|---|---|---|---|
| 3,372,071 | 3/1968 | Wisman et al. | 437/928 |
| 3,390,025 | 6/1968 | Strieter | 437/928 |
| 3,583,361 | 6/1971 | Laudel | 204/298.05 X |
| 3,713,911 | 1/1973 | Larkin et al. | 437/935 |
| 4,389,299 | 6/1983 | Adachi et al. | 204/298.05 X |
| 4,415,421 | 11/1983 | Sasanuma | 204/298.05 X |
| 4,418,283 | 11/1983 | Trotel | 250/492.2 |
| 4,504,558 | 3/1985 | Bohlen et al. | 430/246 |
| 4,520,269 | 5/1985 | Jones | 430/296 |
| 4,717,644 | 1/1988 | Jones et al. | 250/492.3 |
| 4,743,766 | 5/1988 | Nakasuji et al. | 250/398 |
| 4,854,265 | 8/1989 | Ohta et al. | 204/298.05 X |
| 4,960,072 | 10/1990 | Ohta et al. | 204/298.05 X |

Primary Examiner—Nam Nguyen
Attorney, Agent, or Firm—Cooper & Dunham

[57] ABSTRACT

A thin film deposition system includes a vacuum or evacuated casing in which there is introduced an active gas or an inert gas or a mixture thereof. A filament emits thermions which impinge upon gas molecules to ionize them into positive ions. The ions bombard a target, from which particles are emitted toward a substrate. The particles emitted from the target are also ionized by the thermions. In the vicinity of a grid, more particles from the target are ionized by thermions which are vertically oscillated and ionized molecules of the gas. The ions are accelerated toward the substrate and bombard the substrate, thereby depositing a thin film thereon. The thin film deposition system may additionally have an evaporation source for supporting an evaporant which emit particles to be deposited on the substrate.

1 Claim, 3 Drawing Sheets

THIN FILM DEPOSITION SYSTEM

BACKGROUND OF THE INVENTION

1. Field of the Invention

The present invention relates to a thin film deposition system for depositing thin films while simultaneously utilizing the strong reaction of the chemical vapor deposition (CVD) process and the film growth in a high vacuum of the physical vapor deposition (PVD) process, and also for easily depositing compound thin films.

2. Prior Art

Among well known thin film deposition systems for depositing thin films on substrates are CVD and PVD systems. The CVD systems provide a strong reactive process, whereas the PVD systems can deposit dense, strong thin films in a high vacuum.

There have been proposed various thin film deposition systems and processes based on the CVD and PVD principles. However, these conventional thin film deposition systems have been disadvantageous in that a substrate and a thin film deposited thereon are not intimately joined together, it is difficult to deposit a thin film on a substrate which is not resistant to heat, and desired compound thin films cannot easily be deposited.

Various efforts have been made to solve the above problems. One attempt is directed to a thin film deposition system known as an ion plating system. In the ion plating system, a high-frequency electromagnetic field is generated between an evaporation source supporting an evaporant and an object on which a thin film is to be deposited, thereby ionizing the evaporant which is evaporated in an active gas or an inert gas and depositing the ionized evaporant as a thin film on the object in a vacuum. According to another proposal, a DC voltage is applied between an evaporation source and an object on which a thin film is to be deposited in a thin film deposition system known as a DC ion plating system. For further details, reference should be made to Japanese Patent Publications Nos. 52(1977)-29971 and 52(1977)-29091, for example.

Still another thin film deposition system which has been proposed to eliminate the drawbacks is disclosed in Japanese Laid-Open Patent Publication No. 59(1984)-89763. In the disclosed system, a substrate is held on an electrode confronting an evaporation source, a grid is disposed between the confronting electrode and the evaporation source, and a filament for emitting thermions is disposed between the grid and the evaporation source. The grid is held at a positive potential with respect to the filament while a thin film is being deposited on the substrate.

More specifically, the material which has been evaporated from the evaporation source is ionized by thermions emitted from the filament, and the ionized material is accelerated by an electric field directed from the grid toward the confronting electrode when the ionized material passes through the grid. The accelerated ionized material impinges upon the substrate, whereupon a thin film is deposited on the substrate in intimate adhesion thereto.

When a multiple-element thin film such as an ITO film whose properties are greatly variable by a small doped amount of a certain element is to be deposited, it is difficult for the conventional thin film deposition systems to effectively introduce such a small amount of an element into the film.

SUMMARY OF THE INVENTION

In view of the aforesaid shortcomings of the conventional thin film deposition systems, it is an object of the present invention to provide a thin film deposition system which can deposit a thin film on a substrate in highly strong adhesion thereto, which substrate may be a plastic material or the like that is not resistant to heat, and which can easily deposit a compound thin film and a multiple-element thin film.

According to a first aspect of the present invention, there is provided a thin film deposition system comprising a vacuum casing for introducing therein an active gas or an inert gas or a mixture of an active gas and an inert gas, a target electrode for holding a target, the target electrode being disposed in the vacuum casing, a confronting electrode for supporting a substrate on which a thin film is to be deposited, the confronting electrode being disposed in the vacuum casing with the substrate positioned in confronting relation to the target electrode, a grid for passing therethrough particles emitted from the target held by the target electrode, the grid being disposed between the target electrode and the confronting electrode, a filament for ionizing particles emitted from the target, the filament being disposed between the grid and the target electrode, means for keeping the grid positive in potential with respect to the confronting electrode and the filament, and means for applying a high-frequency voltage to the target electrode.

Thermions emitted from the filament bombard gas molecules, ionizing them into positive ions which sputter the target. Then, particles are emitted from the target, and ionized into positive ions by the thermions. The positively ionized particles from the target pass through the grid, where more target particles are ionized into positive ions by ionized particles of the gas in the vacuum casing. The positive ions are accelerated toward the substrate under the electric field between the grid and the substrate, and impinge upon the substrate, thus depositing a thin film thereon.

The thermions are emitted from the filament with an amount of kinetic energy which corresponds to the temperature of the filament. Therefore, the thermions are not first absorbed by the grid at a positive potential, but pass through the grid. Then, the thermions are pulled back toward the grid under Coulomb force and pass again through the grid. The thermions are thus oscillated across the grid until finally they are absorbed by the grid. Since the thermions from the filament do no reach the substrate and hence the substrate is not subjected to electron bombardment, the substrate is not heated and is prevented from a temperature rise.

The target electrode, to which a high-frequency voltage is applied, supports the target which may be an electrically conductive or insulative material which may be a single material, an alloy, a compound, or a combination thereof. If the target is electrically conductive, then the high-frequency voltage is applied to the target electrode through a capacitor. If the target is electrically insulative, then the high-frequency voltage is applied directly to the target electrode.

Since the mobility of electrons is greater than that of ions, the surface of the electrically insulated target is negatively charged, and hence is negatively biased with respect to the filament. The positive ions which are ionized by the thermions traveling between the filament and the grid are directed toward the target surface, thereby sputtering the target surface at high speed. Particles are then ejected from the target upon ion bombardment and directed toward the substrate, on which a thin film is deposited.

According to a second aspect of the present invention, there is also provided a thin film deposition system comprising a vacuum casing for introducing therein an active gas or an inert gas or a mixture of an active gas and an inert gas, an evaporation source for evaporating an evaporant in the vacuum casing, the evaporation source being disposed in the vacuum casing, a confronting electrode for supporting a substrate on which a thin film is to be deposited, the confronting electrode being disposed in the vacuum casing with the substrate positioned in confronting relation to the evaporation source, a grid for passing therethrough particles evaporated from the evaporant on the evaporation source, the grid being disposed between the evaporation source and the confronting electrode, a filament for ionizing the particles evaporated from the evaporant, the filament being disposed between the grid and the evaporation source, a target electrode for holding a sputtering target, the target electrode being positioned closer to the evaporation source than the filament, means for keeping the grid positive in potential with respect to the confronting electrode and the filament, and means for applying a high-frequency voltage to the target electrode.

Thermions emitted from the filament bombard gas molecules and particles evaporated from the evaporant, thereby ionizing some of the evaporant particles into positive ions. The positively ionized particles from the evaporant pass through the grid, where more evaporant particles are ionized into positive ions by ionized particles of the gas in the vacuum casing. The positive ions are accelerated toward the substrate under the electric field between the grid and the substrate, and impinge upon the substrate, thereby depositing a thin film on the substrate.

The other details of the thin film deposition system according to the second aspect as to structure and operation are the same as those of the thin film deposition system according to the first aspect of the present invention.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
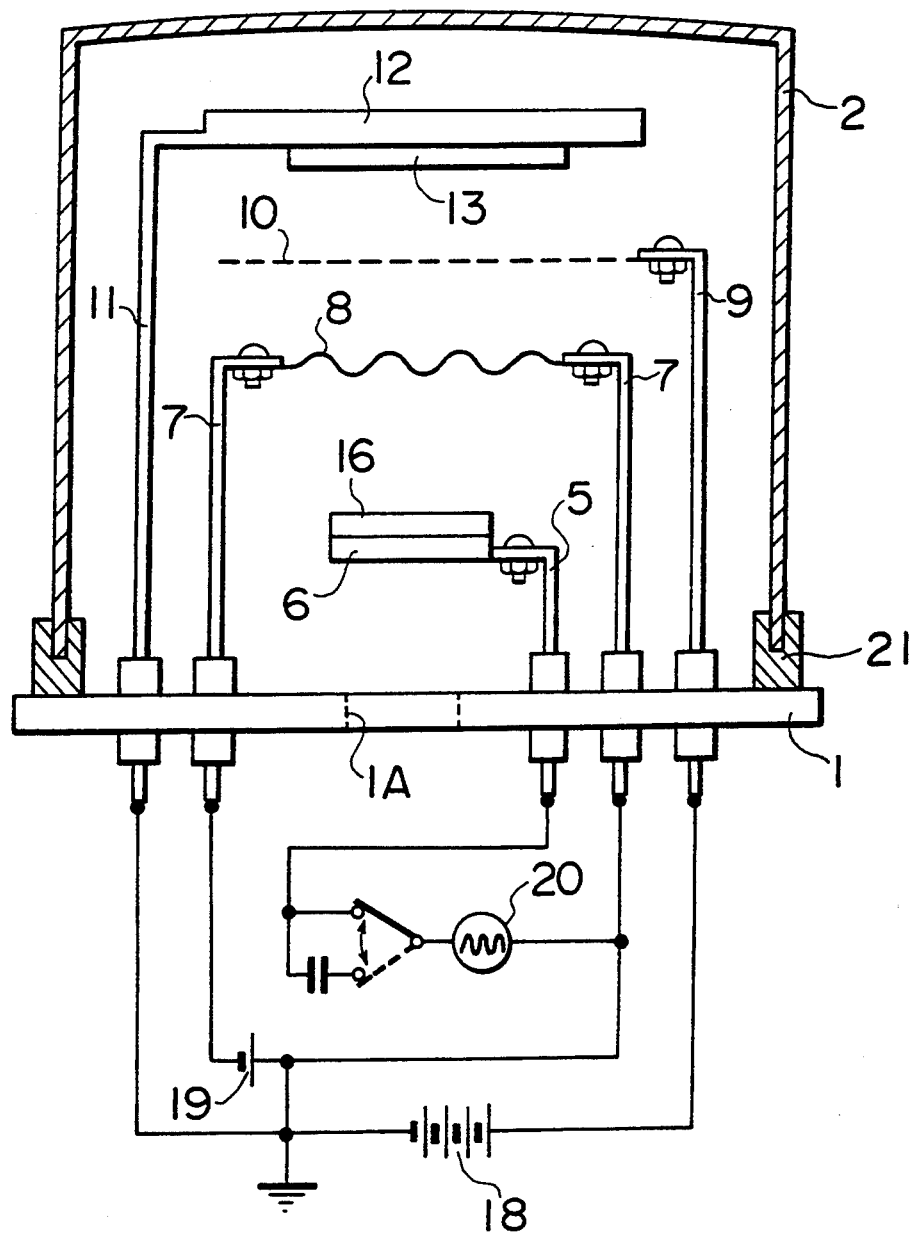
FIG. 1 is a schematic cross-sectional view of a thin film deposition system according to an embodiment of the present invention.

Like or corresponding parts are denoted by like or corresponding reference numerals throughout views.

FIG. 1 schematically shows a thin film deposition system according to an embodiment of the present invention.

The thin film deposition system includes a base plate 1, a gasket 21 mounted on the base plate 1, and a bell jar 2 placed on the gasket 21. The bell jar 2 and the base plate 1 are hermetically coupled to each other by the gasket 21, jointly providing a vacuum or evacuated casing. A plurality of electrodes 5, 7, 9, 11, which also serve as supports, are mounted on and extend through the base plate 1 in hermetically sealed and electrically insulated relationship. The base plate 1 has a central hole 1a defined therein which is coupled to a vacuum system (not shown), so that a vacuum can be developed in the evacuated casing by the vacuum system.

A target electrode 6 is supported on the electrode 5, and a sputtering target 16 is held on the target electrode 6.

The electrode 7 comprises a pair of electrode members which support therebetween a filament 8 of tungsten or the like for emitting thermions. The filament 8 may be in the form of a plurality of parallel filaments or a filament mesh for covering the area in which particles evaporated from the target 16 are spread. The electrode 9 supports a grid 10 which is of such a configuration as to pass the evaporated particles from the target 16. In the embodiment shown in FIG. 1, the grid 10 is in the form of a mesh.

A confronting electrode 12 is supported on the distal end of the electrode 11. A substrate 13, on which a thin film is to be deposited, is supported by a suitable means on the confronting electrode 12 at its lower surface facing the target 16. As viewed from the target 16, the confronting electrode 12 is located behind the substrate 13.

The electrodes 5, 7, 9, 11 are made of an electrically conductive material and have ends projecting through the base plate 1 out of the evacuated casing. Various electric power supplies are connected between the projecting ends of these electrodes 5, 7, 9, 11. In the illustrated embodiment, the electrode 9 is connected to the positive terminal of a DC voltage power supply 18, and the electrode 11 is connected to the negative terminal of the DC voltage power supply 18. A DC power supply 19 is connected between the paired electrodes 7. The DC power supply 19 has a positive terminal connected to the negative terminal of the DC power supply 18 and also to ground. Instead, the negative terminal of the DC power supply 19 may be connected to the negative terminal of the DC power supply 18. The DC power supply 19 may be replaced with an AC power supply. A high-frequency power supply 20 is connected between the electrode 5 and one of the electrode members 7 which is connected to the positive terminal of the DC power supply 19. If the target 16 is electrically conductive, then the high-frequency power supply 20 is connected through a capacitor between the electrodes 5, 7. The positive terminal of the DC power supply 19 and the negative terminal of the DC power supply 18 may not necessarily be grounded.

Actually, the power supplies are connected to the electrodes through wires associated with switches (not shown). The process of depositing thin films on substrates is carried out when these switches are operated on. However, the switches are omitted from illustration for the sake of brevity.

A process of depositing a thin film with the thin film deposition system shown in FIG. 1 will now be described below.

First, the bell jar 2 is opened, and the substrate 13 is supported on the confronting electrode 12, and the target 16 is placed on the target electrode 6. Thereafter, the bell jar 2 is closed, and the casing is evacuated to develop a vacuum therein by the vacuum system.

The material of the target 16 and a gas to be introduced into the casing are selected depending on the type of a thin film to be deposited.

For example, if the target 16 is of aluminum (Al) and the introduced gas is oxygen ($O_2$), then a film of $Al_2O_3$ is deposited on the substrate 13. If the target 16 is of titanium (Ti) and the introduced gas is nitrogen ($N_2$), then a film of TiN is deposited on the substrate 13. If the target 16 is of an alloy of iron and nickel (Fe-Ni alloy) and the introduced gas is argon (Ar), then a magnetic film of Fe - Ni alloy is deposited on the substrate 13. If the target 16 is of indium (In) and tin (Sn) and the introduced gas is $O_2$, then an ITO film is deposited on the substrate 13.

The casing is evacuated to a vacuum ranging from $10^{-5}$ to $10^{-6}$ Torr, and an active gas or an inert gas or a mixture of active and inert gases is introduced into the evacuated casing under a pressure ranging from $10^{-2}$ to $10^{-3}$ Torr. It is assumed here that the introduced gas is an inert gas such as of argon or the like.

The power supplies of the thin film deposition system are now turned on to apply a positive potential to the grid 10 and energize the filament 8. The filament 8 is heated by resistance heating thereby to emit thermions.

The argon molecules in the evacuated casing eject electrons from their outermost shell when impinging upon thermions emitted from the filament 8, so that the argon molecules are ionized into positive ions. Under a high-frequency voltage applied to the target electrode 6, the surface of the electrically insulated target 16 is negatively charged, and the argon ions are directed toward the target surface, thus sputtering the target surface at high speed. Particles are ejected from the sputtered target 16 upon ion bombardment and directed toward the substrate 13.

The particles emitted from the target 16 are spread as they travel to the substrate 13. Some of these particles and the introduced gas in the evacuated casing collide with thermions emitted from the filament 8, ejecting out electrodes from their outermost shell.

The particles emitted from the target 16, which are partly ionized, pass through the grid 10. When these particles pass through the grid 10, they impinge upon vertically oscillating thermions near the grid 10 and also the ionized particles of the introduced gas, and are ionized into more positive ions. Therefore, the ratio at which the particles from the target 16 are ionized is increased by the grid 10.

The positively ionized sputtering particles are accelerated toward the substrate 13 under the electric field directed from the grid 10 toward the confronting electrode 12. These particles therefore bombard the substrate 13 with high energy, thereby depositing a thin film on the surface of the substrate 13 in highly intimate adhesion thereto.

Most of the thermions emitted from the filament 8 are finally absorbed by the grid 10. Although some of the thermions pass through the grid 10, they are decelerated under the electric field between the grid 10 and the substrate 13, and their energy is not strong enough to heat the substrate 13 even if they reach the substrate 13.

In the thin film deposition system shown in FIG. 1, as described above, since the ratio at which the sputtering particles are ionized is very high, they can easily be combined with an active gas which may be introduced singly or in combination with an inert gas into the evacuated casing, so that a desired compound thin film having desired properties can be deposited on the substrate 13 with ease.

The thermions emitted from the filament 8 are effective to ionize particles of the gas introduced in the evacuated casing. Therefore, even under a high vacuum under a pressure of $10^{-4}$ or lower, the sputtering particles can be ionized, and hence the deposited thin film can be highly dense in structure. Although it is generally known that the density of a thin film is smaller than the density of bulk materials, thin films which are deposited by the thin film deposition system according to the present invention has a density that is highly close to the density of bulk materials. Inasmuch as the film growth is effected under such a high vacuum, any entrapment or inclusion of molecules of the introduced gas into the thin film being deposited is greatly reduced, with the result that the deposited film film is of high purity. Consequently, the thin film deposition system according to the present invention lends itself to the deposition of semiconductor thin films for the fabrication of ICs and LSI circuits, highly pure metallic thin films for use as electrodes of ICs and LSI circuits, and insulative thin films, and also to the deposition of thin films of magnetic alloys and multiple-element compound thin films. Especially, the thin film deposition system is suitable for the deposition of semiconductor thin films such as ITO films whose properties are variable in the presence of a small amount of a certain element doped therein.

Figure 2:
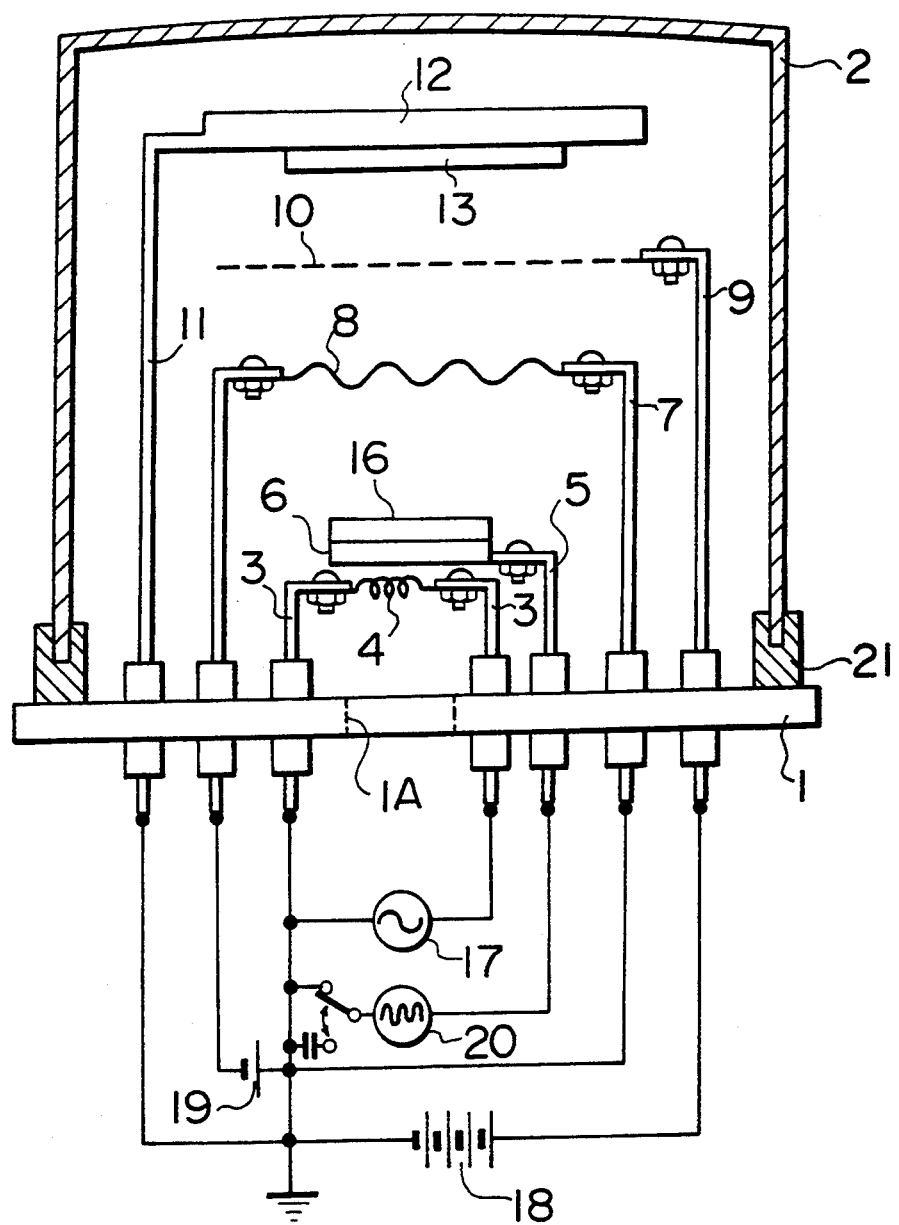
FIG. 2 is a schematic cross-sectional view of a thin film deposition system according to another embodiment of the present invention.

FIG. 2 schematically shows a thin film deposition system according to another embodiment of the present invention.

The thin film deposition system shown in FIG. 2 differs from the thin film deposition system shown in FIG. 1 in that the thin film deposition system shown in FIG. 2 employs, as a material to be deposited as a thin film, a sputtering target 16 and an evaporation source 4, rather than only the sputtering target 16 in the thin film deposition system shown in FIG. 1. Those parts shown in FIG. 2 which are identical to those shown in FIG. 1 are denoted by identical reference numerals, and will not be described in detail.

Figure 3:
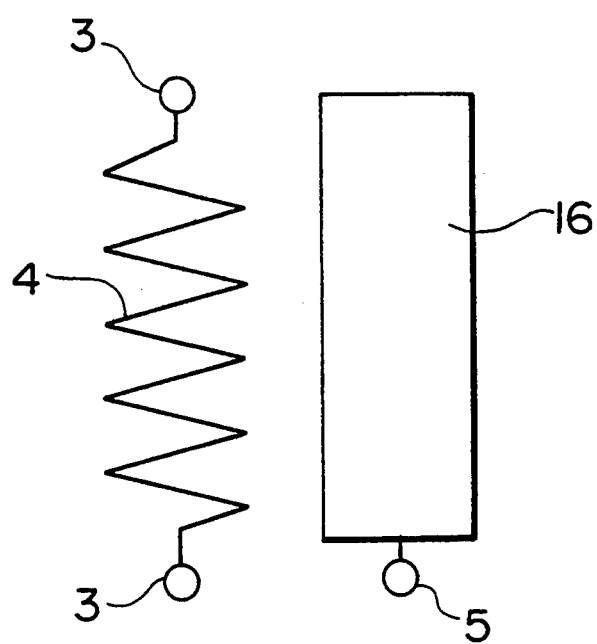
FIG. 3 is a schematic view of an evaporation source and a target as viewed from a substrate in the thin film deposition system shown in FIG. 2.

As shown in FIG. 2, the evaporation source 4 of the resistance heating type is in the form of a coil of a metal such as tungsten, molybdenum, or the like and is supported between a pair of electrodes 3. The electrodes 3 are mounted on and extend through the base plate 1, and electrically connected to an evaporation power supply 17. The evaporation source 4 may be replaced with an evaporation source such as a beam evaporation source used in any of other conventional vacuum evaporation systems. The target electrode 6 supported on the electrode 5 is positioned closer to the evaporation source 4 than the filament 8. The evaporation source 4 and the target electrode 6 are located side by side as shown in FIG. 3 as viewed from the substrate 13, so that particles evaporated from the evaporation source 4 will not be obstructed in their travel toward the substrate 13 by the target 16 held on the target electrode 6.

The thin film deposition system shown in FIG. 2 operates to deposit a thin film on the substrate 13 as follows:

First, the bell jar 2 is opened, and the substrate 13 is supported on the confronting electrode 12. An evaporant is placed on the evaporation source 4, and the target 16 is placed on the target electrode 6. Thereafter, the bell jar 2 is closed, and the casing is evacuated to develop a vacuum therein by the vacuum system.

The material of the target 16 and a gas to be introduced into the casing are selected depending on the type of a thin film to be deposited.

For example, in order to deposit a magnetic film of Fe-Ni alloy, Fe is selected as the evaporant, Ni as the target 16, and Ar as the introduced gas. Alternatively, Fe may be selected as the target 16, and Ni as the evaporant. In order to deposit an ITO thin film, In is selected as the evaporant, Sn as the target 16, and $O_2$ as the introduced gas. In order to deposit a Ti-Al-N compound thin film, Al is selected as the evaporant, Ti as the target 16, and $N_2$ as the introduced gas. Alternatively, Ti may be selected as the evaporant and AlN as the target 16.

The casing is evacuated to a vacuum ranging from $10^{-5}$ to $10^{-6}$ Torr, and an active gas or an inert gas or a mixture of active and inert gases is introduced into the evacuated casing under a pressure ranging from $10^{-2}$ to $10^{-3}$ Torr. It is assumed here that the introduced gas is an inert gas such as of argon or the like.

The power supplies of the thin film deposition system are now turned on to apply a positive potential to the grid 10 and energize the filament 8. The filament 8 is heated by resistance heating thereby to emit thermions. The thermions emitted from the filament 8 are accelerated by the electric field developed between the grid 10 and the filament 8 while they are traveling toward the grid 10. The thermions impinge upon particles evaporated from the evaporant and particles of the introduced gas, which particles are present in the vicinity of the grid 10, thereby ionizing these particles. As a result, a plasma condition is created in the space in the vicinity of the grid 10. Under a high-frequency voltage applied to the target electrode 6, the surface of the electrically insulated target 16 is negatively charged, and the ions are directed toward the target surface, thus sputtering the target surface at high speed. Particles are ejected from the sputtered target 16 upon ion bombardment and directed toward the substrate 13.

The particles emitted from the target 16 are spread as they travel to the substrate 13. Some of these particles and the introduced gas in the evacuated casing collide with thermions emitted from the filament 8, ejecting out electrodes from their outermost shell. Therefore, the particles from the target 16 and the particles of the gas are ionized into positive ions.

The particles emitted from the evaporant and the target 16, which are partly ionized, pass through the grid 10. When these particles pass through the grid 10, they impinge upon vertically oscillating thermions near the grid 10 and also the ionized particles of the introduced gas, and are ionized into more positive ions. Therefore, the ratio at which the particles from the target 16 are ionized is increased by the grid 10.

The positively ionized evaporant and sputtering particles are accelerated toward the substrate 13 under the electric field directed from the grid 10 toward the confronting electrode 12. These particles therefore bombard the substrate 13 with high energy, thereby depositing a thin film on the surface of the substrate 13 in highly intimate adhesion thereto.

Most of the thermions emitted from the filament 8 are finally absorbed by the grid 10. Although some of the thermions pass through the grid 10, they are decelerated under the electric field between the grid 10 and the substrate 13, and their energy is not strong enough to heat the substrate 13 even if they reach the substrate 13.

In the thin film deposition system shown in FIG. 2, as described above, since the ratio at which the evaporant and sputtering particles are ionized is very high, they can easily be combined with an active gas which may be introduced singly or in combination with an inert gas into the evacuated casing, so that a compound thin film having desired properties can be deposited on the substrate 13 with ease.

With the present invention, as described above, the thin film deposition system can deposit a thin film on a substrate in highly intimate adhesion thereto. Since the evaporant and sputtering particles as ionized have a high electric energy (i.e., electron and ion temperatures), thin films which require reaction and crystallization can be produced without thermal energy in the form of high reaction and crystallization temperatures, and hence can be formed at low temperature. Therefore, plastic materials which are less resistant to heat can be used as substrates on which thin films are to be deposited. The sputtering target may be made of an insulative material. The thin film deposition system may be used to carry out a reactive film growth process in which an insulative film is deposited on the surface of the target, and also to deposit a multiple-element thin film such as a thin film of magnetic Fe-Ni alloy. The thin film deposition system is particularly effective to dope a thin film with a small amount of a certain element that greatly affects the properties of the thin film, e.g., to dope an indium oxide film with tin when an ITO film is to be formed, or to dope a zinc oxide film with aluminum.

Although certain preferred embodiments have been shown and described, it should be understood that many changes and modifications may be made therein without departing from the scope of the appended claims.

What is claimed is:

1. A thin film deposition system comprising:
   a vacuum casing for introducing therein an active gas or an inert gas or a mixture of an active gas and an inert gas;
   an evaporation source for evaporating an evaporant in said vacuum casing, said evaporation source being disposed in said vacuum casing;
   a confronting electrode for supporting a substrate on which a thin film is to be deposited, said confronting electrode being disposed in said vacuum casing with the substrate positioned in confronting relation to said evaporation source;
   a grid for passing therethrough particles evaporated from the evaporant on said evaporation source, said grid being disposed between said evaporation source and said confronting electrode;
   a filament for ionizing the particles evaporated from the evaporant, said filament being disposed between said grid and said evaporation source;
   a target electrode for holding a sputtering target, said target electrode being positioned closer to said evaporation source than said filament and said target being parallel to the filament;
   means for keeping said grid positive in potential with respect to said confronting electrode and said filament; and
   means for applying a high-frequency voltage to said target electrode.

* * * * *